(12) United States Patent
Tyler et al.

(10) Patent No.: US 7,940,499 B2
(45) Date of Patent: May 10, 2011

(54) MULTI-PAD SHARED CURRENT DISSIPATION WITH HETEROGENIC CURRENT PROTECTION STRUCTURES

(75) Inventors: Matthew A. Tyler, Kaysville, UT (US); John J. Naughton, Idaho Falls, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 956 days.

(21) Appl. No.: 11/532,478

(22) Filed: Sep. 15, 2006

(65) Prior Publication Data
US 2008/0067602 A1   Mar. 20, 2008

(51) Int. Cl.
 *H02H 9/00* (2006.01)
 *H02H 3/08* (2006.01)
 *H02H 9/02* (2006.01)
(52) U.S. Cl. .................................. 361/56; 361/93.1
(58) Field of Classification Search ............. 361/56, 361/93.1
See application file for complete search history.

(56) References Cited

U.S. PATENT DOCUMENTS

| | | | | |
|---|---|---|---|---|
| 4,870,530 | A | 9/1989 | Hurst et al. | 361/91 |
| 5,012,317 | A | 4/1991 | Rountre | 357/38 |
| 5,400,202 | A | 3/1995 | Metz et al. | 361/56 |
| 5,602,404 | A | 2/1997 | Chen et al. | 257/112 |
| 5,675,469 | A | 10/1997 | Racino et al. | 361/212 |
| 5,721,445 | A | 2/1998 | Singh et al. | 257/369 |
| 5,731,941 | A * | 3/1998 | Hargrove et al. | 361/56 |
| 5,780,905 | A | 7/1998 | Chen et al. | 257/355 |
| 6,344,385 | B1 | 2/2002 | Jun et al. | 438/237 |
| 6,376,882 | B1 | 4/2002 | Huang et al. | 257/355 |
| 6,548,360 | B2 | 4/2003 | Huang et al. | 438/300 |
| 6,552,399 | B2 | 4/2003 | Jun et al. | 257/357 |
| 6,690,067 | B2 * | 2/2004 | Ker et al. | 257/355 |
| 6,717,219 | B1 | 4/2004 | Vashchenko et al. | 257/355 |
| 6,756,834 | B1 * | 6/2004 | Tong et al. | 327/309 |
| 6,770,918 | B2 | 8/2004 | Russ et al. | 257/173 |
| 6,784,029 | B1 | 8/2004 | Vashchenko et al. | 438/129 |
| 6,933,540 | B2 | 8/2005 | Liu et al. | 257/173 |
| 6,933,546 | B2 | 8/2005 | Khemka et al. | 257/199 |
| 6,946,708 | B2 * | 9/2005 | Okazaki | 257/355 |
| 7,112,853 | B2 * | 9/2006 | Li et al. | 257/362 |
| 7,580,233 | B2 * | 8/2009 | Davis | 361/56 |
| 2004/0070900 | A1 * | 4/2004 | Ker et al. | 361/56 |
| 2004/0136126 | A1 * | 7/2004 | Smith | 361/56 |
| 2007/0127173 | A1 * | 6/2007 | Chang | 361/56 |

* cited by examiner

*Primary Examiner* — Dharti H Patel
(74) *Attorney, Agent, or Firm* — Robert F. Hightower

(57) ABSTRACT

Current protection in integrated circuit having multiple pads. Different types of current protection structures may be associated with different pads. A common current discharge or charge path may be used to provide current to or draw current from various of these heterogenic current protection structures. Since a common current discharge or charge path is used, the metallization used to formulate a discharge solution is significant simplified. Additionally, the protection structures may be provided with selectively conductive regions that are approximately radially symmetrical around the circumference of the pad. Accordingly, if the protection structures are slightly off center with respect to the bond pad (due to, for example, mask alignment error), the error in the amount of active region around the circumference of the pad is at least partially averaged out.

19 Claims, 6 Drawing Sheets

MULTI-PAD SHARED CURRENT DISSIPATION WITH HETEROGENIC CURRENT PROTECTION STRUCTURES

BACKGROUND

Electronic circuitry provides complex functionality that is proving ever more useful. In one common form, circuitry is formed on a semiconductor or other substrate using microfabrication processing technology. Typically, circuits with small feature dimension sizes are not designed to carry large amounts of current. So long as the voltage range at any given node does not extend outside of its designed range, these currents remain relatively low and the circuitry will typically operate as designed. However, if the voltage range at any given node extends out of its designed range, a condition of Electrical OverStress (EOS) may occur.

For example, most common semiconductor fabrication processes use substrate or bulk semiconductor with different dopants implanted into certain regions of the substrate. These implant regions define unique electrical characteristics that are important or essential for circuit functionality. Thus, EOS experienced at any of the implant regions may adversely impact circuit performance. Another area where EOS may adversely affect performance is in the interlayer dielectrics, which have voltage limitations as well. Driving a circuit outside of its normal operating range can often temporarily disable performance of the circuit, reduce the operational lifetime of the circuit, or even immediately destroy the circuit. EOS can take many forms, but commonly takes the form of Electro Static Discharge (ESD) events.

Many current protection structures have been designed that are suitable for dissipating current to or from corresponding critical circuit nodes in order to provide protection to corresponding circuitry. Conventionally, a more likely source of excess current is on the pads of integrated circuits, where externally generated voltages and currents are applied to the integrated circuit. To deal with the potential of EOS events occurring at a given pad, conventional circuits often have current protection structures at or near each pad.

Conventionally, each current protection structure discharges current to a power domain that is local to its respective core circuitry. This is true regardless of whether the protection structure is uni-directional (i.e., a protection structure that triggers current discharge only of one of the positive or negative excessive voltage condition) or bi-directional (i.e., a protection structure that triggers current discharge of both positive and negative excessive voltage conditions). This network of EOS protection structures results in complex metallization schemes with large pad structures with multiple circuit-wide interconnection busses. The complexity of such metallization requires significant space on the integrated circuit. To exacerbate the problem, the complex metallization causes significant voltage drops across the metallization, which is often countered by using strategically placed voltage clamps distributed throughout the circuit. Such distributed voltage clamps, of course, require additional circuit space.

Currently, a circuit may operate in multiple voltage domains. For instance, mixed signal integrated circuits are in widespread use. Such mixed signal integrated circuits operate using digital voltage and current signals (thus operating in the digital voltage domain) as well as analog voltage and current signals (thus operating in the analog voltage domain). Furthermore, there are often components of a circuit that operate using different useful voltages. For instance, there may be high voltage components that high voltages may be acceptably applied to (thus operating in a high voltage domain), whereas other components may be lower voltage components for which such high voltages may represent a definitive EOS condition (thus operating in a lower voltage domain). The use of mixed signal integrated circuits complicates the metallization complexity with the need for signal isolation based on voltage range or signal type. Typical circuitry has pads for a particular voltage domain in one portion of the circuit to provide signal isolation. These complex networks of protection structures and bussing increase the risk for signal corruption, excessive pad loading, leakage current, and decreased durability when exposed to EOS events.

BRIEF SUMMARY OF THE INVENTION

Embodiments of the present invention relate to an integrated circuit that includes multiple pads. The pads may take any form including bond pads, contact pads, or any other mechanism for applying electrical signals to the integrated circuit. Different types of current protection structures may be associated with different sets of one or more of the pads. For instance, as an example only, there might be analog protection structures to protect analog pads, and digital protection structures to protect digital pads. Furthermore, although not required, the current protection structures may have different trigger points, or may simply just have different circuits. A common current discharge or charge path may be used to provide current to or draw current from various of these heterogenic current protection structures. Since a common current discharge or charge path is used across multiple current protection structures, the metallization used to formulate a discharge solution is significantly simplified, even if the current protection structures themselves are quite different.

Additionally, in accordance with another embodiment of the invention, the current protection structures may be provided with active current dissipation regions that are approximately radially symmetric around the circumference of the pad. Accordingly, if the protection structures are slightly off center with respect to the bond pad (due to, for example, mask alignment error), any error in spacing between active regions around the circumference of the pad is at least partially averaged out.

These and other features of the embodiments of the present invention will become more fully apparent from the following description and appended claims, or may be learned by the practice of the invention as set forth hereinafter.

BRIEF DESCRIPTION OF THE DRAWINGS

To further clarify the above and other advantages and features of embodiments of the present invention, a more particular description of the embodiments of the invention will be rendered by reference to the appended drawings. It is appreciated that these drawings depict only typical embodiments of the invention and are therefore not to be considered limiting of its scope. The embodiments will be described and explained with additional specificity using the accompanying drawings in which.

DETAILED DESCRIPTION OF THE PREFERRED EMBODIMENTS

Embodiments of the present invention relate to the use of a common discharge or charge path to serve multiple pad-oriented heterogenic current protection structures, even though those protection structures are structured differently or perhaps even serve different voltage domains. Accordingly, the common discharge or charge path may provide a discharge path for analog and/or digital pads, high voltage pads and/or normal voltage pads, or other heterogenic voltage domain situations. The integrated circuit may be included within a larger system, such as, for example, a computing system or an automobile to provide significant performance enhancements to that larger system.

Figure 1:
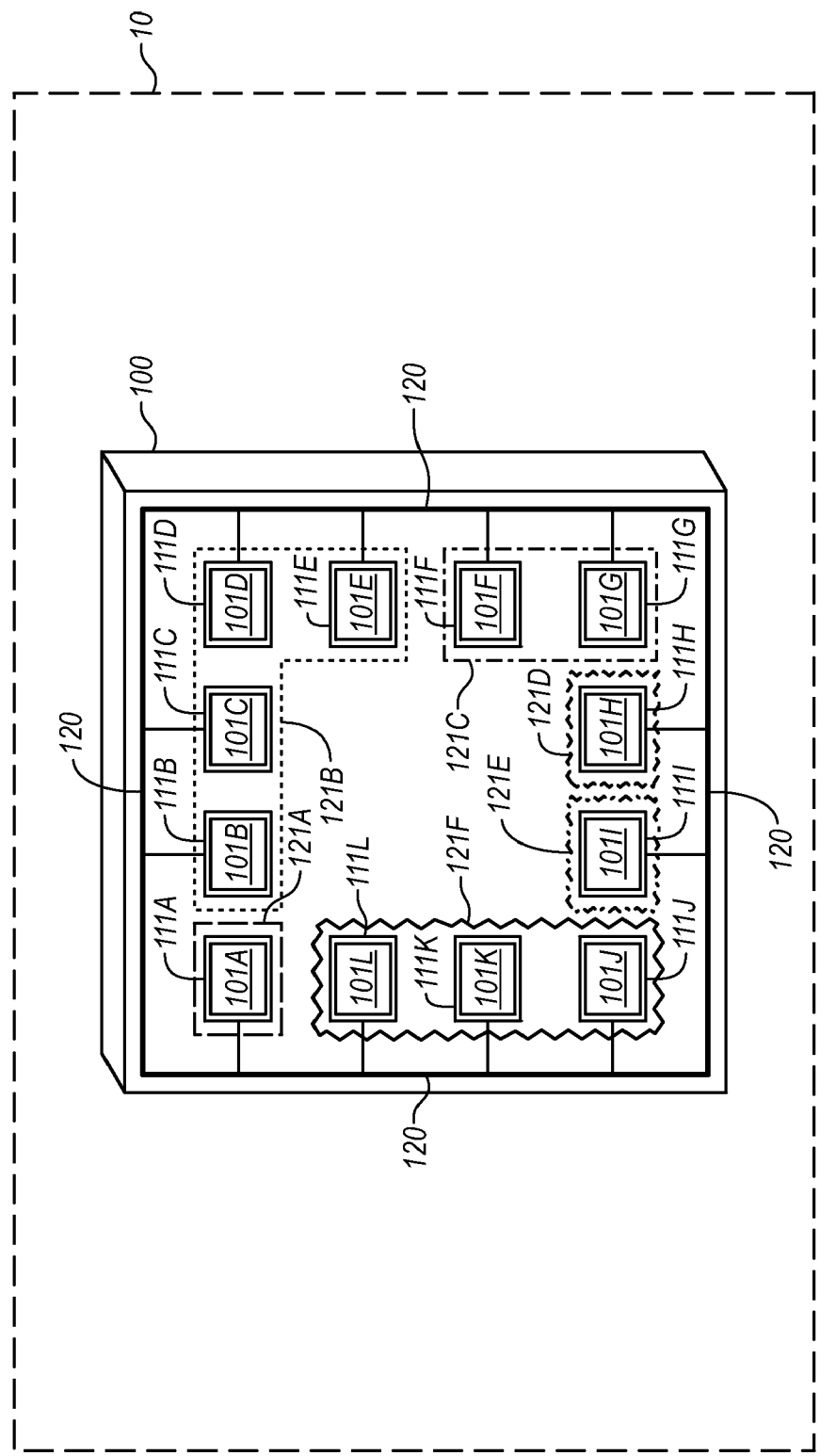
FIG. 1 illustrates a system that includes a circuit with multiple pads, and with multiple different current protection structures that share a common current discharge and charge path.

FIG. 1, for example, illustrates a system 10 that includes an integrated circuit 100. The integrated circuit 100 includes a number of pads 101A through 101L (referred to sometimes collectively as "pads 101"). In the illustrated embodiment, the integrated circuit 100 has 12 pads, although there is no significance attached whatsoever to this particular number of pads. The principles of the present invention may just as well apply to integrated circuits with any multiple number of pads. Furthermore, although the pads are illustrated as being squares in FIG. 1 taking on perhaps the appearance of a bond pad, the principles of the present invention are not limited to the particular form of the pad. In this description and in the claims, a "pad" of a circuit is simply any electrical connection that has the capability to interface with components external to the circuit. An appropriate selection of a pad type is a design choice that will depend on the configuration of the circuit package.

Each of the pads 101 has an associated current protection structure. With reference to FIG. 1, each of the pads 101A through 101L has a corresponding current protection structure 111A through 111L, respectively. The current protection structures 111A through 111L will sometimes be referred to herein collectively as "current protection structures 111". The current protection structures 111 serve to provide appropriate current protection for their corresponding pads. If, at any of the corresponding pads, one or more conditions occur that are indicative of an Electrical OverStress (EOS) event, the associated current protection structure activates to discharge current from or charge current to the associated pad. This positive or negative current dissipation protects the core circuitry from excessive currents.

The current protection structures 111 may be partially or fully heterogenic. The current protection structures 111 may be "partially heterogenic" in that at least some of the current protection structures 111 may have different structures. The current protection structures 111 may even be "fully heterogenic" in that the principles of the present invention are still applicable even if all of the current protection structures 111 have different structures. "Different structures" as the term is used herein when applied to describe the current protection structures 111 is more than mere processing variations that might result from the imperfect manufacture of the same structural design of a current protection structure. Processing technology inherently results in some structural differences even if starting from the same circuit design, even when that design is repeated on the same wafer or die. Instead, "different structures" as the term is used herein are structures that are formulated from different designs.

One reason for having different structures for the current protection structures 111 is that each pad 101 may have a distinct voltage domain. Proper current protection for a particular voltage domain may require different designs to assign proper current protection given each voltage domain's anticipated normal operation. For example purposes only, a dashed box 121A is illustrated as surrounding the pad 101A, symbolizing that the pad 101A serves a particular voltage domain (also referred to herein as "voltage domain 121A"). Some pads may be of a common voltage domain. For instance, a dotted box 121B surrounds the pads 101B through 101E, symbolizing that the pads 101B through 101E each serve a common voltage domain (also referred to herein as "voltage domain 121B"). Likewise, as symbolically illustrated, pads 101F and 101G are associated with a common voltage domain 121C, pad 101H is associated with voltage domain 121D, pad 101I is associated with voltage domain 121E, and pads 101J through 101L are associated with a common voltage domain 121F. The voltage domains 121A through 121F may be referred to hereinafter collectively as "voltage domains 121".

A "voltage domain" is defined by its expected normal voltage operation. As a corollary to that statement, "different voltage domains" are domains in which the expected normal operational voltages are different. For instance, pads that correspond to a digital voltage domain are expected to have digital voltages (but not analog voltages) applied during normal operation. On the other hand, pads that correspond to an analog voltage domain are expected to have analog voltages (but not digital voltages) applied during normal operation. Also, a pad may correspond to a mixed signal voltage domain if the pad normally operates with both digital and analog signals. The analog voltage domain, the digital voltage domain, and the mixed signal voltage domains are each different voltage domains.

A pad may even have multiple voltage domains. For instance, one pad might be a high voltage digital pad, thereby permitting normal operation at high voltages. On the other hand, a normal voltage digital pad might be expected to experience lower voltages during normal operation. A digital voltage domain might also be defined by the expected voltage levels representing binary one and zero signals. A digital voltage domain might also be defined by the number of acceptable digital levels. For instance, a digital pin sometimes might have a high and a low discrete level, as well as one (or more) intermediate discrete voltage level defining one (or more) intermediate digital values.

As another example of multiple voltage domains, an analog pin may have a particular expected voltage range, while another analog pin may have a different voltage range.

Regardless of whether one voltage range overlaps (partially or fully) or not with the other voltage range, these analog pins will have different voltage domains due to their difference in acceptable voltage ranges. As the termed is used herein, pins have "different voltage domains" so long as any one of the voltage domains of one pad is different than any of the one or more voltage domains of the other pad. Thus, even pads that belong to the same voltage domain (e.g., the analog voltage domain) may have different voltage domains, just as people have different characteristics even though they are in some ways the same.

Voltage domains may also be defined by whether the corresponding current protection structure has a positive or negative trigger voltage, or both. In this description and in the claims, a "positive trigger voltage" is a voltage level that if experienced at the pad will cause significant current to be drawn by the current protection structure from the pad, thereby resulting in a sharp voltage drop at the pad. On the other hand, a "negative trigger voltage" is a voltage level that if experienced at the pad will cause significant current to be provided by the current protection structure to the pad, thereby causing a sharp increase in the voltage at the pad towards ground.

Current protection structures that have both a positive and negative trigger voltage are bi-directional. However, the current protection structure need not have both a positive and a negative trigger voltage to be "bi-directional", as the term is used herein. For example, a bi-directional current protection structure may just have a positive trigger voltage, but when a negative voltage is encountered, the current protection structure may behave more as a diode in the negative direction. On the other hand, a bi-directional current protection structure may just have a negative trigger voltage, but when a positive voltage is encountered, the current protection structure might simply behave as a diode in the positive direction. A voltage domain may also be defined by the level of the positive and/or negative trigger voltage of a current protection structure corresponding to a pad.

Referring to FIG. 1, although the circuit 100 is shown as including six voltage domains 121A through 121F, the principles of this particular embodiment of the present invention may apply to a circuit that has any configuration of voltage domains and any correlation of such voltage domains to pads.

In any case, a current protection structure is activated upon the detection of one or more conditions at an associated pad, or at a node that is close to the pad. The one or more conditions will depend on the voltage domain of the pad. For instance, current protection structure 111A may be said to be of a first voltage domain 121A if the current protection structure 111A serves to discharge current from or charge current to any of its associated pad 101A when a first set of one or more voltage conditions is present at the pad 101A. On the other hand, current protection structures 111B through 111E may be said to be of a second voltage domain 121B if the current protection structures 111B through 111E each serve to discharge current from or charge current to its associated pads (in the illustrated case, pads 101B through 101E, respectively) when a second set of one or more voltage conditions is present at the associated pad 101B through 101E. Similarly, current protection structures 111F and 111G may be said to be of a third voltage domain 121C if the current protection structures 111F and 111G each serve to discharge current from or charge current to its associated pad (in the illustrated case, pads 101F and 101G) when a third set of one or more voltage conditions is present at the associated pad 101F and 101G. The same might be said for voltage domains 121D through 121F as well.

A current discharge or charge path 120 serves at least two of the current protection structures 111, but possibly more than two or even all of the current protection structures 111. Accordingly, if any of the current protection structures 111 connected to the path 120 were to trigger, the trigger current protection structure may then use the path 120 to shunt current. By sharing the current discharge or charge path across multiple current protection structures, the amount of space occupied to discharge or charge current is greatly reduced. Furthermore, since the current protection structures 111 are situated between the respective pads 101 and the current charge or discharge path 120, the voltage on the current charge or discharge path 120 need not be carefully regulated in many applications. Thus, there may often be no particular need for distributed voltage clamps on the current charge or discharge path 120.

Moreover, when an EOS event occurs across any two pads coupled to the common charge or discharge path 120, the common charge or discharge path 120 serves to provide a low impedance route for the current to shunt through. For instance, suppose that an ElectroStatic Discharge (ESD) event occurs between pads 101B and 101I of circuit 100 of FIG. 1, each of the current protection structures 111B and 111I may trigger thereby providing a low voltage drop across the current protection structures 111B and 111I. Since the common charge or discharge path 120 may be low impendance since due to it being shared, a low impedance path is created from the pad 101B, through the current protection structure 111B, through the common charge or discharge path 120, through the current protection structure 111I and to pad 101I. The dangerous ESD current is thus taken safely off the circuit 100 through this shunting operation.

The low impedance property of this shunt path means that the current will likely follow the shunt path, rather than flow through undesirable paths in the protected circuitry to other pads thereby causing harm to the protected circuitry. Since the ESD current has little drive to follow such undesirable paths through protected circuitry, pads of very different voltage domains may be placed closer to each other or even interleaved with greater assurance that the shunt path will be used in case of an ESD event. For instance, a high voltage pad may be placed proximate to low voltage pads without particular concern. Thus, the principles of the present invention may provide considerable design flexibility in placement of different pad types on an integrated circuit.

Figure 2:
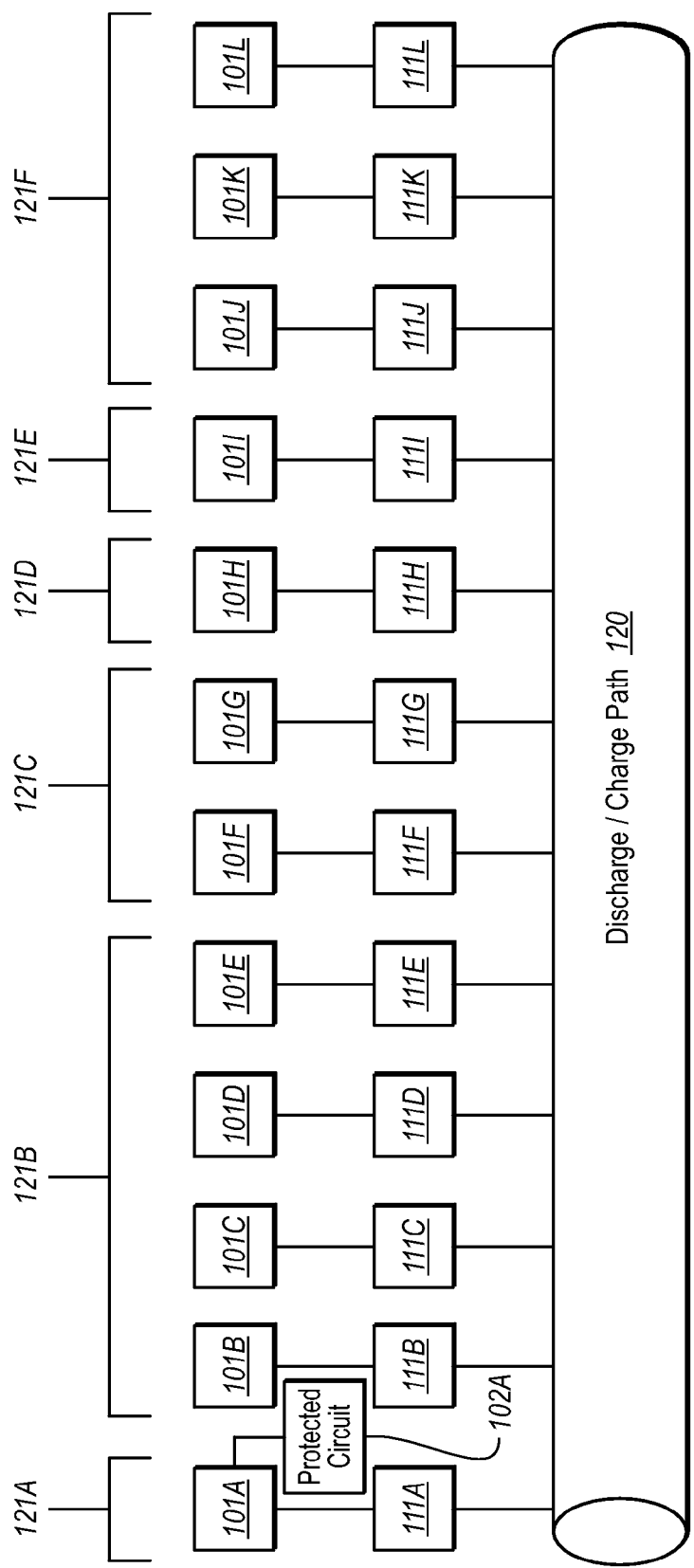
FIG. 2 schematically illustrates an electrical relation between the pads, the current protection structures, and the common current discharge or charge path.

FIG. 2 illustrates a schematic 200 of the electrical connections of the circuit 100 of FIG. 1. For each of the pads 101, the associated current protection structure 111 intervenes to provide current to or draw current from the associated pad 101. The voltage domains 121 are also identified by bracketing the corresponding pads 101 and current protection structures 111.

Referring to pad 101A, for example, if the current protection structure 111A is not activated, then signals applied to the pad 101A are provided to the protected circuit 102A. On the other hand, if excessive current or voltage is applied to the pad 101A due to, for example, electrostatic discharge, the current protection structure 111A activates and draws current from the pad 101A into the discharge/charge path 120. Conversely, if excessive current is drawn from the pad 101A due to, for example, negative electrostatic discharge, the current protection structure 111A may potentially activate and provide current from the current discharge/charge path 120 to the pad 101A. In any of these cases, the protected circuitry 102A does not experience physical damage or degradation.

Figure 3A:
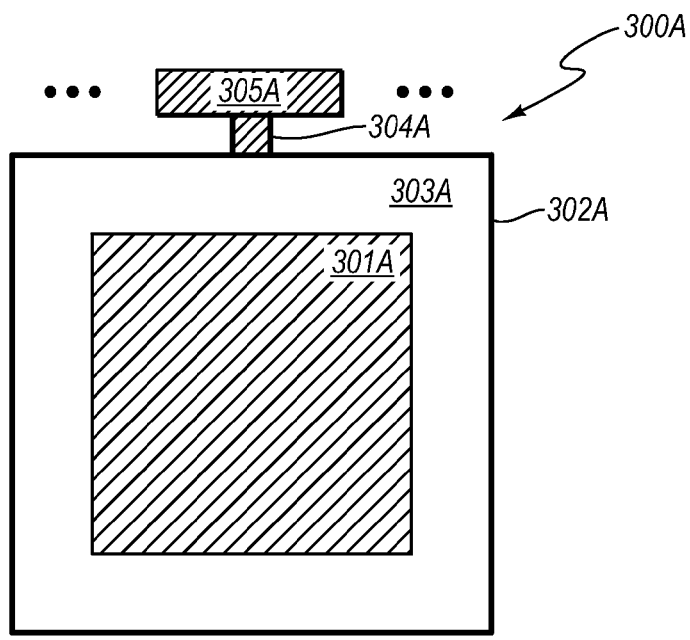
FIG. 3A illustrates a designed layout of a pad, an associated current protection structure that is radially symmetric with the pad, and a portion of the current discharge or charge path.

FIG. 3A illustrates a specific layout 300A of a pad 301A in conjunction with a current protection structure 303A and a current discharge/charge path 305A. As previously noted, the current protection structure 303A is associated with a single pad 301A. Although the pad 301A is illustrated as being square-shaped, the pad 301A may take any form. The pad 301A may be provided at one terminal of the current protection structure. The region 303A represents a selectively conductive region of the current protection structure. At the outer perimeter of the current protection structure 303A lies a conductive material 302A (also referred to herein as the "perimeter terminal 302A") that serves as the other terminal of the current protection structure 303A. The perimeter terminal 302A of the current protection structure is electrically connected (as represented by connection 304A) to the current discharge/charge path 305A that is shared amongst multiple pads and current protection structures.

In operation, if the current protection structure is activated, current passes through the selectively conductive region 303A in an appropriate direction between the pad 301A and the perimeter terminal 302A. The perimeter terminal 302A is electrically coupled to the common current discharge/charge path 305A through the connection 304A thereby allowing the path 305A to serve as a current source or sink for the current protection structure 303A. The precise nature of the connection between the perimeter terminal 302A and the current discharge/charge path 305A is not important to the principles of the present invention. In one embodiment, one of the sides of the perimeter terminal may simply be the common discharge/charge path that is connected to one or more other current protection structures. In another embodiment, the path 305A may underly or overly much or all of the pad 301, but at a different metal layer.

In the specific example of FIG. 3A, the selectively conductive region 303A of the current protection structure is designed to be radially symmetrical around the pad 301A. In other words, given any radial line extending outwards from the center of the pad 301A, the ratio of the distance from the center to where the line intersects the outer edge of the pad 301A to the distance from the center to where the line intersects the perimeter terminal 302A will be approximately constant as the radial line is rotated in a circle about the center of the pad 301A.

This design is desirable in that breakdown activation of the current protection structure 303A will occur throughout the entire area of the current protection structure 303A. However, given the intricate and sometimes imprecise nature of semiconductor processing technology, it is difficult to precisely align one circuit structure with another.

Figure 3B:
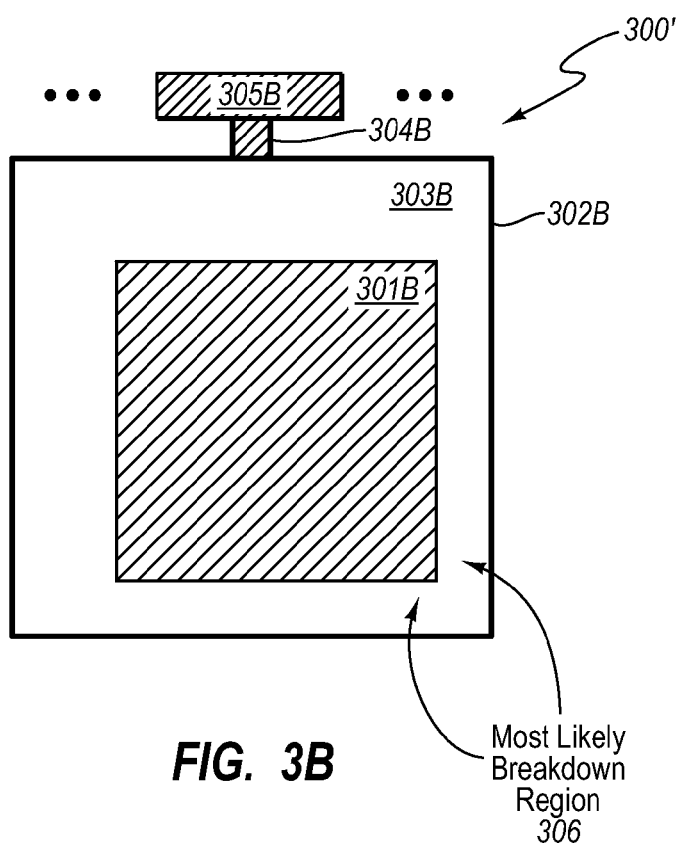
FIG. 3B illustrates the layout of FIG. 3A if subjected to some misalignment error between the pad and the current protection structure.

For instance, FIG. 3B illustrates a similar structure as compared to FIG. 3A, with elements 301B through 305B of FIG. 3B approximately correlating to elements 301A through 305A, respectively, of FIG. 3A. However, one primary difference is that the pad 301B is not perfectly aligned with respect to the current protection structure 303B. This might cause breakdown to occur at region 306, rather than more uniformly across the entire structure. While this misalignment may have been exaggerated, there will always be some finite amount of misalignment between two circuit elements due to mask alignment error. Since the current protection structure 303B is designed to be radially symmetric around the pad 301B, however, the alignment errors should remain relatively small regardless of the direction of misalignment. Without being radial symmetric, the direction of misalignment would be more significant since misalignment in one direction might cause a high activation voltage, whereas the same distance of misalignment in the other direction might cause a lower activation voltage. Thus, the radial symmetry in the design of the current protection structure 303B and the pad 301A permits for greater control over the activation voltage.

Accordingly, embodiments have been described in which multiple heterogenic current protection structures may be served by a single common current discharge or charge path. Furthermore, an example of a current protection structure that is designed to be radially symmetric with respect to a pad has been described. The precise nature of the current protection structure is not critical to the invention so long as the current protection structure is able to provide a low impedance shunt path to and from a common charge/discharge path. In one example, the current protection structure provides normal operation during a moderate reverse voltage mode, while still providing current dissipation functions if excessive positive or negative currents are experienced. Such an example will now be described with respect to FIGS. 4 through 7. Although the specific example is described with respect to FIGS. 4 through 7, the principles of the present invention are not limited to any particular usage of a current protection structure. As such, FIGS. 4 through 7 should not be construed in any way to restrict the broader principles of the present invention.

Figure 4:
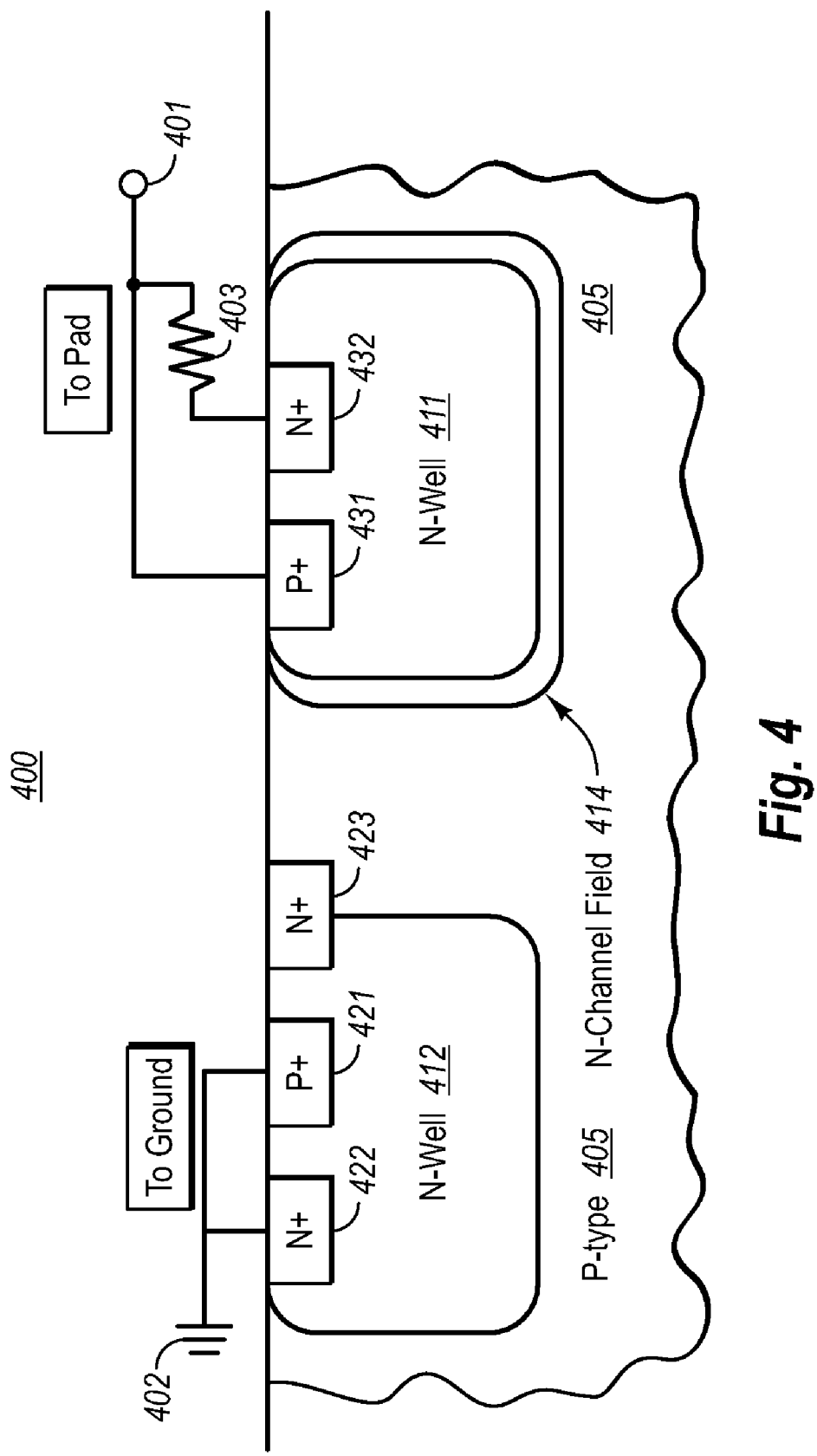
FIG. 4 illustrates a combined cross-sectional view and schematic diagram of a current protection structure that may be used as one of the current protection structures of FIG. 1, 2, 3A or 3B.

FIG. 4 illustrates a current protection structure 400 manufactured on a semiconductor substrate that may be used to protect circuitry from EOS while permitting operation in a reverse voltage condition. The current protection structure is described in further detail in commonly-owned co-pending U.S. patent application Ser. No. 11/532,477 entitled "Single Well Excess Current Dissipation Circuit" filed on the same day herewith, which application is incorporated herein by reference in its entirety.

For clarity, portions of the current protection structure 400 are illustrated in cross-section as they might be processed on a semiconductor substrate, while other portions are illustrated using simple circuit symbols. In addition to providing reverse voltage protection without triggering the current protection structure 400, the current protection structure 400 may also be processed using a single-well technology in which all wells are manufactured of the same polarity (i.e., all n-type or all p-type). In the illustrated case of FIG. 4, all of the wells are n-type.

In this description and in the claims, an "n-type" region or "n-region" of a semiconductor material is said to have an n-type polarity and is a region in which there are more n-type dopants than p-type dopants, if there are any p-type dopants at all. On the other hand, a "p-type" region or "p-region" of a semiconductor material is said to have a p-type polarity and is a region in which there are more p-type dopants than n-type dopants, if there are any n-type dopants. Generally, the p-type polarity is considered to be the opposite of the n-type polarity.

The current protection structure 400 includes two autonomous n-well regions 411 and 412 within a p-type semiconductor substrate 405. An "n-well" region is a well that is formed as an n-type region within a larger p-type region, as opposed to a "p-well" region which is formed as a p-type region within a larger n-type region. Techniques for forming n-well and p-well regions in a substrate are well known in the art and thus will not be discussed here. It will be understood that a p-type semiconductor region in contact with an n-type semiconductor region will cause a diode effect, with current being permitted to pass from the p-type region to the n-type region if the voltage at the p-type region is higher than the voltage at the n-type region. However, current is not permitted to flow from the n-type region to the p-type region absent a significantly high voltage at the n-type region with respect to the p-type region. This higher voltage is often referred to as a diode's "breakdown" voltage or "reverse breakdown" voltage.

Occasionally, while describing the operation of the current protection structure 400 of FIG. 4, reference will be made to the PNPNP stack 600 of FIG. 6 which illustrates the relationship of the p-type and n-type junctions of FIG. 4. Likewise, FIG. 7 illustrates the relationship in the form of interconnected bipolar transistors 700.

Figure 6:
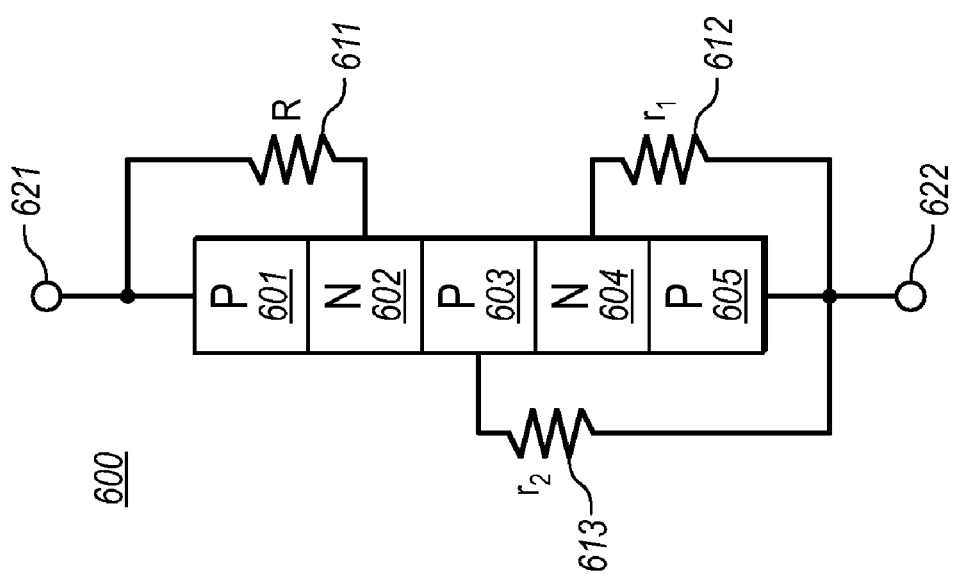
FIG. 6 illustrates a series connection of alternating P-type and N-type regions in a PNPNP configuration used to describe the operation of the current protection structure of FIG. 4.

Since FIG. 6 is used to describe only the principles of operation, the size of the n-type and p-type regions of FIG. 6 are not drawn to scale when compared to the corresponding components of FIG. 4. In FIG. 6, the n-region 602 corresponds to the n-well 411 of FIG. 4, and the n-region 604 corresponds to the n-well 412 of FIG. 4. The p-region 603 corresponds to the p-type substrate 405 of FIG. 4. Note that in FIG. 4, there may be an n-channel field 414 surrounding the n-well 411. The thickness of this n-channel field 414 may be controlled at the time of circuit manufacture to thereby control the breakdown voltage between the diode defined by the n-well 411 and the p-type substrate 405. Mechanisms for forming such an n-channel field of a specific width are known in the art and thus will not be described here. Although not shown, an n-tub of higher n-type dopant density than the n-well 411 may be used internal to the n-well 411 to provide a further adjustment to the breakdown voltage.

Figure 7:
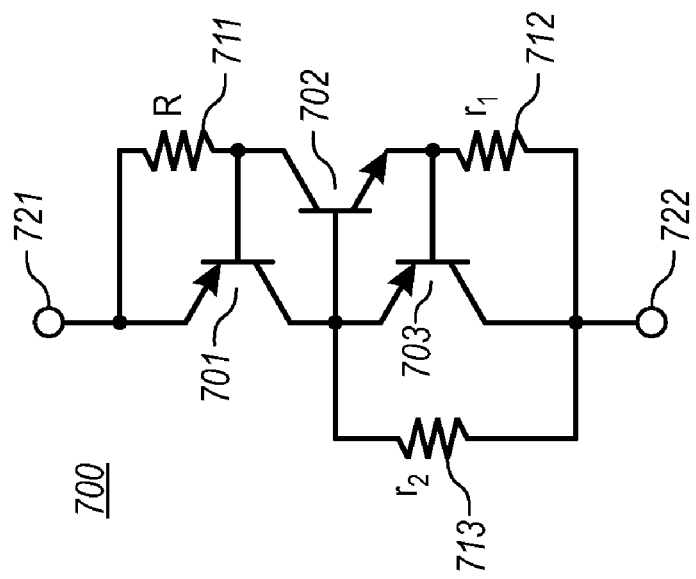
FIG. 7 illustrates a current protection structure of FIGS. 4 and 6 expressed in the form of interconnected bipolar transistors.

Referring to FIGS. 6 and 7, the n-region 602 of FIG. 6 corresponds to the n-type base terminal of the PNP bipolar transistor 701 and the n-type collector terminal of the NPN bipolar transistor 702, which are shown coupled together in FIG. 7 since the terminals are both formed using the same n-type region 602. Also, the n-region 604 of FIG. 6 corresponds to the n-type emitter terminal of the NPN bipolar transistor 702 and corresponds to the n-type base terminal of the PNP bipolar transistor 703. Once again, these terminals are coupled together since they are formed of the same n-type region 604 The p-region 603 of FIG. 6 corresponds to the p-type collector terminal of PNP bipolar transistor 701, the p-type emitter terminal of PNP bipolar transistor 703, and the p-type base terminal of NPN bipolar transistor 702, which are shown coupled together.

Referring back to FIG. 4, the n-well 411 is coupled to a first circuit node 401 through a first parallel combination of a p-type contact region 431 and an n-type contact region 432. The net dopant density of each of the p-type contact region 431 and the n-type contact region 432 is greater than the net dopant density of the n-well 411. This higher net dopant density is expressed in FIG. 4 by the p-type contact region 431 being designated as "P+", and the n-type contact region 432 being designated as "N+". The "net dopant density" is the concentration per unit volume of dominant dopant species (n-type dopants if an n-type region, and p-type dopants if a p-type region) minus the concentration per unit volume of minority dopant species (p-type dopants if an n-type region, and n-type dopants if a p-type region).

Referring to FIGS. 4 and 6, the p+ contact region 431 of FIG. 4 corresponds to the p-region 601 of FIG. 6. The p-region 601 is coupled to one terminal 621 of the PNPNP stack 600. The terminal 401 of FIG. 4 corresponds to the terminal 621 of FIG. 6. The resistor 403 of FIG. 4 corresponds to the resistor 611 of FIG. 6 having resistance R. Referring to FIGS. 4 and 7, the p+ contact region 431 of FIG. 4 corresponds to the p-type emitter terminal of the PNP bipolar transistor 701. The terminal 401 of FIG. 4 corresponds to terminal 721 of FIG. 7. The resistor 403 of FIG. 4 corresponds to the resistor 711A of FIG. 7.

Referring back to the illustrated embodiment of FIG. 4, the n+ contact region 432 is coupled to the first circuit node 401 through a resistor circuit element 403. In this description and in the claims, a "resistor circuit element" is a resistor that is specifically formed as a desired portion of a circuit pattern. The p+ contact region 431 is coupled to the first circuit node 401 without an intervening resistor circuit element in the illustrated embodiment.

A second n-well 412 is coupled to the second circuit node 402 through a parallel combination of a p+ contact region 421 and an n+ contact region 422. In the illustrated embodiment, the third and fourth contact regions 421 and 422 are coupled to the second circuit node 402 without an intervening resistor element. In one embodiment, the first circuit node 401 is an I/O pad in which input and/or output signals may be applied. The second circuit node 402 may be a substantially fixed voltage supply such as, for example, ground. The substrate 405 may also be connected to ground. The remaining circuit elements 423 serve to reduce the breakdown voltage of the diode defined by the interface between the n-well 411 to p-type substrate 405.

Referring to FIGS. 4 and 6, the p+ contact region 421 of FIG. 4 corresponds to the p-region 605 of FIG. 6. The second circuit node 402 of FIG. 4 corresponds to the circuit node 622 of FIG. 6. Since the n-well 412 is connected through the n+ region 422 to the circuit node 402 with some resistance, FIG. 6 shows a small resistor 612 having resistance r1 coupled between the n-region 604 and the second circuit node 622. Furthermore, since p-type substrate 405 may well be grounded, and the second circuit node 402 is grounded, the p-region 603 is shown coupled to the second circuit node 622 through resistor 613 having resistance r2. The resistors r1 and r2 may be parasitic, as opposed to an expressed resistor circuit element in the design. However, the resistors may also be expressed design elements.

Referring to FIGS. 4 and 7, the p+ contact region 421 of FIG. 4 corresponds to the p-type collector terminal of PNP bipolar transistor 703 of FIG. 7. The second circuit node 402 of FIG. 4 corresponds to the circuit node 722 of FIG. 7. Since the n-well 412 is connected through the n+ region 422 to the circuit node 402 with some resistance, FIG. 7 shows a small resistor 712 having resistance r1 coupled between the n-type base terminal of PNP bipolar transistor 703 and the second circuit node 722. Furthermore, since p-type substrate 405 may well be grounded, and the second circuit node 402 may well be grounded, the p-type base terminal of NPN bipolar transistor 702 is shown coupled to the second circuit node 722 through resistor 713 having resistance r2.

As will be apparent to those of ordinary skill in the art, the polarities of each of the regions of FIGS. 4, 6 and 7, may be reversed. In other words, p-type regions may be replaced by n-type regions, and vice verse.

Figure 5:
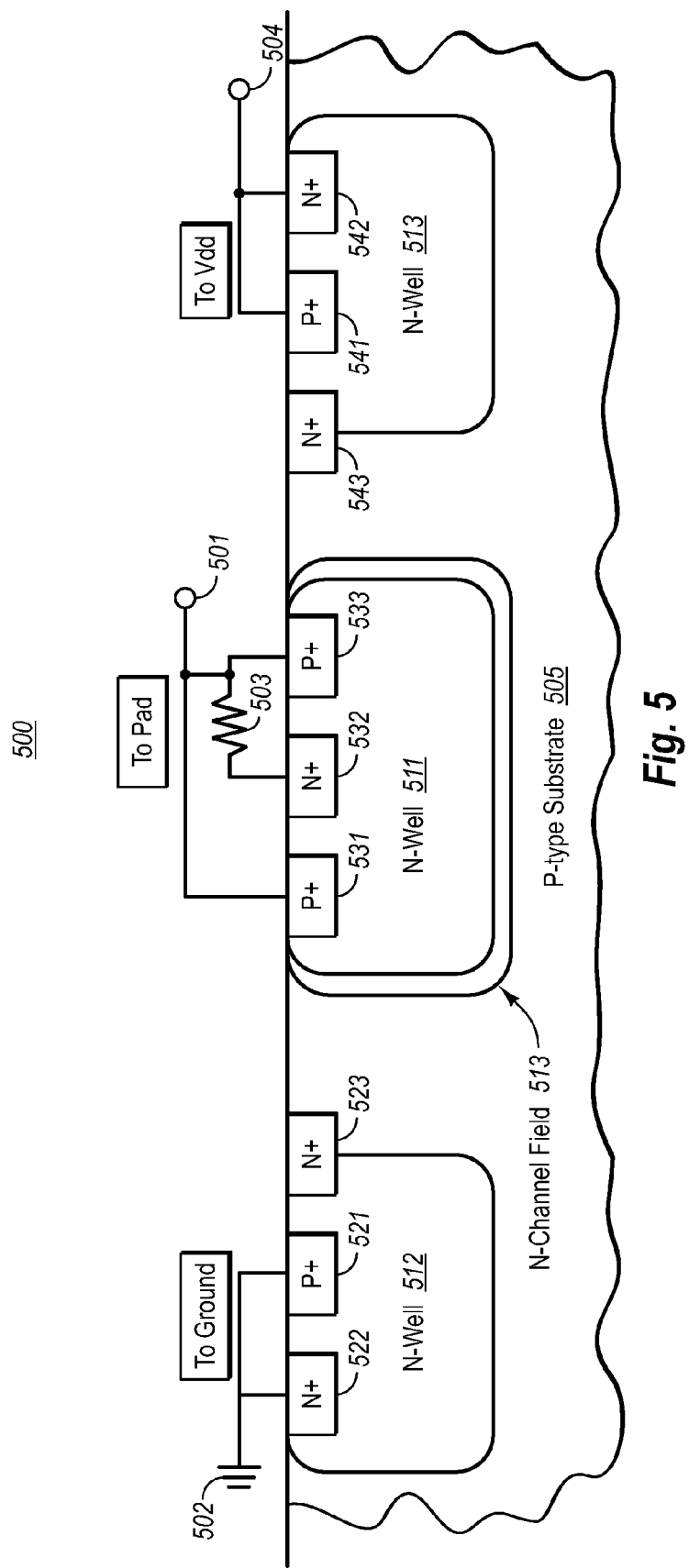
FIG. 5 illustrates a combined cross-sectional view and schematic diagram of a current protection structure that may be used as one of the current protection structures of FIG. 1, 2, 3A or 3B and that may be used with multiple current dissipation conduction paths.

FIG. 5 illustrates a dual reference mode form of the current protection structure 400 of FIG. 4. While the current protection structure 400 of FIG. 4 uses a single reference node 402 as a current source or sink, the current protection structure 500 of FIG. 5 includes two references nodes 502 and 504 to source current to or sink current from the circuit node 501. The operation of the components 501, 502, 503, 505, 511, 512, 521, 522, 523, 531 and 532 of FIG. 5 will operate much as described above for the components 411, 412, 421, 422, 423, 431 and 432 described with respect to FIG. 4 in sourcing or sinking current to or sinking current from circuit node 501 using reference node 502. However, the reference node 504 will operate using regions 541, 542 and 543 within n-well 513 much as described above for the reference node 402 operating using regions 421, 422 and 423 within n-well 412. Accordingly, dual reference node current dissipation is achieved.

Therefore, a current protection structure is further described that permits for proper and adjustable current dissipation while permitted normal reverse voltage operation. Furthermore, this is achieved by using single well technology thereby simplifying the fabrication of the current protection structure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An integrated circuit comprising:
   a plurality of pads;
   a first current protection structure of a first type including a first diode and a second diode, the first current protection structure coupled to a first pad of the plurality of pads such that when a first set of one or more voltage conditions is present at the first pad, the first current protection structure activates to discharge current from or charge current to the first pad, the first set of one or more voltage conditions including a condition of the voltage exceeding a positive trigger voltage wherein at least a selectively conductive region of the first current protection structure is formed on the semiconductor substrate to be radially symmetric around the pad of the plurality of pads such that for a radial line extending outwards from a center of the pad a distance from the center of the pad to where the line intersects an outer edge of the pad has a ratio to a distance from the center of the pad to where the line intersects the perimeter of the selectively conductive region wherein the ratio is approximately constant as the line is rotated in a circle about the center of the pad;
   a second current protection structure of a second type different than the first type, the second current protection structure including a third diode and a fourth diode wherein the second current protection device is coupled to a second pad of the plurality of pads such that when a second set of one or more voltage conditions is present at the second pad, the second current protection structure activates to discharge current from or charge current to the second pad; and
   a current discharge or charge path that serves to provide current to or draw current from both the first current protection structure if activated and the second current protection structure if activated.

2. An integrated circuit in accordance with claim 1, further comprising:
   a third current protection structure of a third type different than the first and second types, the third current protection structure coupled to a third pad of the plurality of pads such that when a third set of one or more voltage conditions is present at the third pad, the third current protection structure activates to discharge current from or charge current to the third pad,
   wherein the current discharge or charge path also serves to provide current to or draw current from both the third current protection structure if activated.

3. An integrated circuit in accordance with claim 1, wherein the positive trigger voltage of the first set of one or more voltages is a first positive trigger voltage, and the second set of one or more voltage conditions includes a condition of the voltage exceeding a second positive trigger voltage that is different than the first positive trigger voltage.

4. An integrated circuit in accordance with claim 3, wherein the negative trigger voltage of the first set of one or more voltages is a first negative trigger voltage, the second set of one or more voltage conditions also includes a condition of the voltage dropping below a second negative trigger voltage.

5. An integrated circuit in accordance with claim 1, wherein negative trigger voltage of the first set of one or more voltages is a first negative trigger voltage, the second set of one or more voltage conditions also includes a condition of the voltage dropping below a second negative trigger voltage.

6. An integrated circuit in accordance with claim 1, wherein the first current protection structure is of a digital voltage domain and the second current protection structure is of an analog voltage domain.

7. An integrated circuit in accordance with claim 1, wherein the first current protection structure is of a digital voltage domain and the second current protection structure is of a mixed voltage domain.

8. An integrated circuit in accordance with claim 1, wherein the first current protection structure is of a mixed signal voltage domain, and the second current protection structure is of an analog voltage domain.

9. An integrated circuit in accordance with claim 1, wherein the first and second current protection structures are both digital, but of different voltage domains.

10. An integrated circuit in accordance with claim 1, wherein the first and second current protection structures are both mixed signal, but of different voltage domains.

11. An integrated circuit in accordance with claim 1, wherein the first and second current protection structures are both analog, but of different voltage domains.

12. A system comprising:
    an integrated circuit, wherein the integrated circuit comprises:
    a semiconductor substrate of a first conductivity type, the semiconductor substrate having a surface;
    a plurality of pads;
    a first current protection structure of a first type, the first current protection structure coupled to a first pad of the plurality of pads such that when a first set of one or more voltage conditions is present at the first pad, the first current protection structure activates to discharge current from or charge current to the first pad, the first current protection structure including a first well of a second conductivity type that is formed on the surface of the semiconductor substrate wherein a first P-N junction is formed within the first well and is coupled to the first pad to form a conduction path from the first pad to the first well, the first current protection structure including a second P-N junction in a current flow path wherein the first well forms a portion of both the first and second P-N junctions and also forms common connection therebetween;
    a second current protection structure of a second type different than the first type, the second current protection structure coupled to a second pad of the plurality of pads such that when a second set of one or more voltage conditions is present at the second pad, the second current protection structure activates to discharge current from or charge current to the second pad, the second current protection structure including a second well of the second conductivity type that is formed on the surface of the semiconductor substrate wherein a third P-N junction is formed within the second well, the second current protection structure including a fourth P-N junction wherein the second well forms a portion of both the third and fourth P-N junctions and also forms a common connection therebetween;

a current discharge or charge path that serves to provide current to or draw current from both the first current protection structure if activated and the second current protection structure if activated; and fifth and sixth P-N junctions formed in the current flow path between the first and second P-N junctions and the current discharge or discharge path.

13. A system in accordance with claim 12, wherein the system. is a computing system.

14. A system in accordance with claim 12, wherein the system is an automobile.

15. The system of claim 12 wherein the second diode is formed between the first well and the semiconductor substrate.

16. A system in accordance with claim 12, wherein the first and second wells are spaced apart and a portion of the semiconductor substrate is disposed between the first and second wells and forms another portion of the second and fourth diodes.

17. An integrated circuit comprising:
a semiconductor substrate;
a plurality of pads formed on the semiconductor substrate; and
a current protection structure for a pad of the plurality of pads, wherein at least a selectively conductive region of the current protection structure is formed on the semiconductor substrate to be radially symmetric around the pad of the plurality of pads and wherein for a radial line extending outwards from a center of the pad, a distance from the center of the pad to where the line intersects an outer edge of the pad has a ratio to a distance from the center of the pad to where the line intersects the perimeter of the selectively conductive region wherein the ratio is approximately constant as the line is rotated in a circle about the center of the pad.

18. An integrated circuit in accordance with claim 17, wherein the current protection structure is a first current protection structure, and the pad is a first pad, the integrated circuit further comprising:
a second current protection structure for a second pad, wherein at least a selectively conductive region of the second current protection structure is designed to be radially symmetric around. the second pad.

19. An integrated circuit in accordance with claim 18, wherein the selectively conductive regions of the first and second protection structures are designed to have the same layout shape.

* * * * *